United States Patent [19]

Kimura et al.

[11] Patent Number: 5,882,730
[45] Date of Patent: *Mar. 16, 1999

[54] METHOD FOR THE PREPARATION OF A DOUBLE-COATED BODY OF BORON NITRIDE

[75] Inventors: Noboru Kimura; Yukio Kurosawa, both of Gunma-ken, Japan

[73] Assignee: Shin-Etsu Chemical Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 499,345

[22] Filed: Jul. 7, 1995

[30] Foreign Application Priority Data

Jul. 12, 1994 [JP] Japan ................................ 6-160111

[51] Int. Cl.$^6$ ...................................................... B05D 3/12
[52] U.S. Cl. ......................... 427/271; 427/275; 427/277; 427/289; 427/292
[58] Field of Search ..................................... 427/271, 122, 427/275, 277, 289, 292, 356, 419.7, 585; 264/163; 219/543, 548, 553

[56] References Cited

U.S. PATENT DOCUMENTS 5,343,022  8/1994  Gilbert, Sr. et al. ................... 219/552
5,681,616  10/1997  Gupta et al. ............................. 427/264

FOREIGN PATENT DOCUMENTS 2273718  6/1994  United Kingdom ................... 427/275

*Primary Examiner*—Shrive Beck
*Assistant Examiner*—Fred J. Parker
*Attorney, Agent, or Firm*—McAulay Nissen Goldberg Kiel & Hand, LLP

[57] ABSTRACT

An improvement is proposed in the preparation of, for example, a ceramic heater consisting of a substrate plate of boron nitride, a patterned layer of pyrolytic graphite (PG) on the substrate to serve as an electric resistance element and an overcoating layer of pyrolytic boron nitride (PBN) in a process comprising the steps of depositing PG on the substrate surface, pattern-wise removing the PG layer by mechanical working to form grooves and depositing PBN all over. According to the inventive improvement, which can be obtained by forming the grooves in such a fashion that the angle between the direction of a normal line to the facet surface formed by the mechanical working and the growing direction of the substrate of boron nitride is in the range from 0° to 45° so that the internal stress caused in the overcoating layer, which is due to the anisotropy in the thermal expansion of boron nitride, is decreased to prevent the overcoating layer from occurrence of cracks and falling during service.

3 Claims, 4 Drawing Sheets

//—

METHOD FOR THE PREPARATION OF A DOUBLE-COATED BODY OF BORON NITRIDE

BACKGROUND OF THE INVENTION

The present invention relates to an improvement in the method for the preparation of a double-coated boron nitride article having an undercoating layer of graphite and an overcoating layer of pyrolytic boron nitride exhibiting excellent heat resistance, corrosion resistance and stability against chemicals and useful as a ceramic heater, electrostatic chuck, thermal radiation-shielding board and cylinder or vessel having a heat sink.

Pyrolytic boron nitride, referred to as PBN hereinafter, has various advantageous properties in respects of the excellent heat resistance, corrosion resistance and chemical stability as well as in respect of the high purity to cause no contamination so that PBN is sometimes used as a material of the overcoating layer on a double-coated ceramic article having an undercoating layer of pyrolytic graphite, referred to as PG hereinafter, on a substrate of a ceramic material such as alumina, silicon nitride, silicon carbide, boron nitride, including sintered boron nitride and PBN, and the like so that the excellent properties of PBN are fully utilized to improve the performance of the ceramic article. For example, Japanese Utility Model Kokai No. 5-90880 discloses a double-coated ceramic heater which comprises an integral body prepared by forming an undercoating layer of PG on a substrate body of PBN and forming an overcoating layer of PBN on the undercoating layer of PG. Japanese Patent Kokai No. 5-105557 further discloses a vessel of PBN provided on the inner surface with an undercoating layer of PG to serve as a heat sink or as an electrically conductive layer and with an overcoating layer of PBN on the undercoating layer to serve for electrical insulation and mechanical protection. In such a double-coated ceramic article, it is sometimes the case that, after formation of the graphite undercoating layer, the graphite layer is pattern-wise removed to expose the underlying ceramic surface so that the graphite layer remaining pattern-wise serves, for example, as an electrical heater element in a ceramic heater, the surface of the pattern-wise graphite layer and the exposed ceramic surface as a whole being coated by the overcoating layer of PBN for electrical insulation and mechanical protection.

One of the problems in the above described double-coated ceramic articles having an overcoating layer of PBN is that the overcoating layer of PBN sometimes suffers from occurrence of cracks therein or exfoliation or falling of the overcoating layer from the undercoating layer of, for example, PG to serve as a heat sink. It is therefore eagerly desired to develop an improved method for the preparation of a double-coated boron nitride article having an undercoating layer of graphite and an overcoating layer of PBN exhibiting excellent heat resistance, corrosion resistance and stability against chemicals without suffering from the above described problems and disadvantages in the prior art articles and useful as a ceramic heater, electrostatic chuck, thermal radiation-shielding board and cylinder or vessel having a heat sink.

SUMMARY OF THE INVENTION

It is therefore an object of the present invention to provide an improved method for the preparation of a double-coated ceramic article having an undercoating layer of PG and an overcoating layer of PBN on the surface of a substrate body of a ceramic material such as boron nitride without the above mentioned problems and disadvantages due to occurrence of cracks in the overcoating layer or falling of the overcoating layer from the undercoating layer.

Thus, the present invention provides, in a method for the preparation of a double-coated ceramic article having an undercoating layer of graphite formed pattern-wise on the surface of a substrate body of boron nitride of which the surface is exposed pattern-wise and an overcoating layer of pyrolytic boron nitride to cover the pattern-wise graphite layer and the pattern-wise exposed substrate surface by first forming a uniform coating layer of graphite over the whole surface of the substrate, then cutting to remove a part of the coating layer of graphite pattern-wise so as to pattern-wise expose the substrate surface and finally forming a layer of pyrolytic boron nitride over the surface of the pattern-wise graphite layer and the pattern-wise exposed substrate surface altogether, the improvement which comprises cutting a part of the graphite layer in such a fashion that the angle formed between the direction of the normal line to the surface of the facet formed by cutting and the direction perpendicular to the plane of the graphite layer before cutting is in the range from 0° to 45°.

DETAILED DESCRIPTION OF THE PREFERRED EMBODIMENTS

It has been unexpectedly discovered that, when a double-coated ceramic article having an undercoating layer of graphite formed on the substrate of boron nitride and an overcoating layer of PBN formed on the undercoating layer is prepared according to the above described improvement of the present invention which has been completed as a result of the extensive investigations undertaken by the inventors for the mechanisms of crack formation in or falling of the overcoating layer of PBN, the overcoating layer of PBN is safe from the disadvantages of crack formation or falling. Namely, the invention has been completed on the findings that the internal stress in the overcoating layer of PBN is localized at the portion of the facet plane formed by mechanical working where the normal line makes a large angle with the direction perpendicular to the surface of the substrate before the pattern-wise mechanical working so that, if the mechanical working be conducted to avoid formation of such a facet plane responsible for the localization of the internal stress in the PBN overcoating layer, the above described disadvantages in the prior art could mostly be removed.

The reason for the localized occurrence of the internal stress in the overcoating layer of PBN consists in the anisotropy of the thermal expansion coefficient in the boron nitride substrate body. Namely, the thermal expansion coefficient ac in the direction perpendicular to the surface of a boron nitride substrate, the substrate surface being perpendicular, when the substrate is formed by sintering of a green body prepared by compression molding, to the direction of compression or, when the substrate is formed by the pyrolytic method, to the direction of the growth of the layer, is sometimes larger by about 10 times than the thermal expansion coefficient αa in the direction within the plane of the substrate surface.

Figure 4:
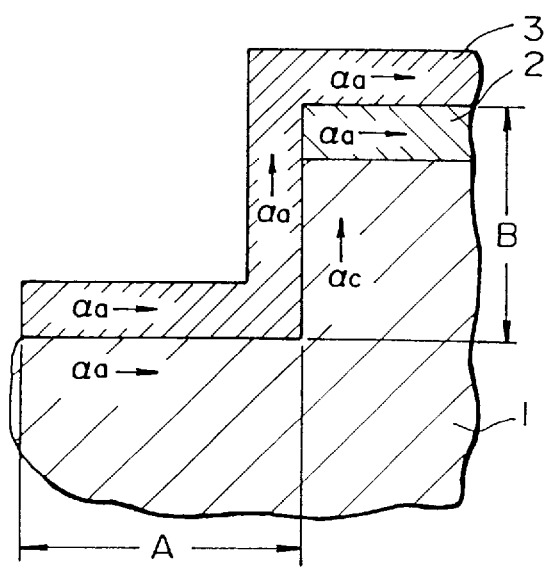
FIG. 4 is a schematic illustration showing the relationship between the thermal expansion coefficient and the direction of the facet plane in the prior art.

Assuming that the substrate is formed also from PBN, this situation is explained by making reference to FIG. 4, in which the facet surface in the part A formed by mechanical working is perpendicular to the growing direction of the PBN substrate 1 so that the thermal expansion coefficient in the direction within the facet surface is αa to be in matching with the thermal expansion coefficient of the PBN overcoating layer 3 in the direction within the substrate surface. In the part B, to the contrary, the surface of the facet formed by the mechanical working for a grooved surface is in parallel to the growing direction of the substrate PBN so that the thermal expansion coefficient of the substrate within the facet plane is αc which is about 10 times larger than the thermal expansion coefficient aa in the direction perpendicular to the growing direction of the PBN substrate. Accordingly, the difference in the thermal coefficient in the part B between the faceted substrate surface and the overcoating layer 3 of PBN within the direction of the facet surface is so great that a large internal stress is produced in the overcoating layer 3 during the cooling step from the temperature of PBN deposition to room temperature.

Figure 1A:
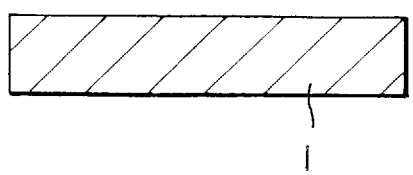
FIGS. 1a to 1f each illustrate a step in the preparation procedure of the double-coated ceramic article according to the invention by a vertical cross sectional view.
Figure 1B:
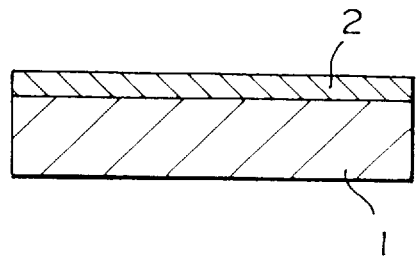
Figure 1C:
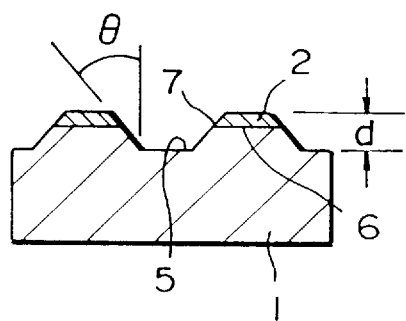
Figure 1D:
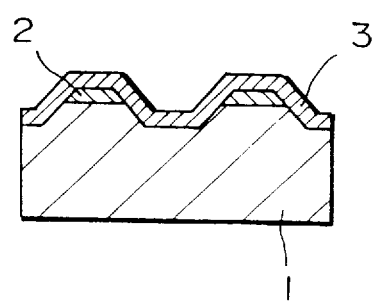
Figure 1E:
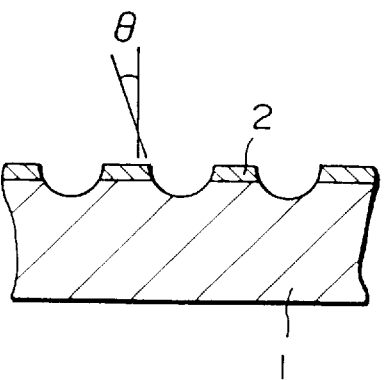

FIGS. 1a to 1f each illustrate a step in the preparation procedure of the double-coated ceramic article such as a ceramic heater according to the invention by a vertical cross sectional view, of which FIG. 1a illustrates a substrate 1 of boron nitride and FIG. 1b illustrates a substrate 1 of boron nitride and an undercoating layer 2 of PG formed on overall the substrate surface. FIGS. 1c and 1e each illustrate the cross sectional view of the substrate 1 and the undercoating layer 2 after the mechanical working for patterning of the undercoating layer 2 to form a grooved surface on which the surface of the substrate 1 is exposed pattern-wise. FIG. 1c is for the groove having a trapezoidal profile of the cross section and FIG. 1e is for the groove having a curved profile of the cross section. The angle indicated by θ is the complementary angle of the angle formed between the direction of the normal line to the facet surface formed by the mechanical working and the growing direction of the PBN substrate, which should be in the range from 0° to 45°. In other words, the complementary angle θ should be in the range from 45° to 90°.

Figure 3:
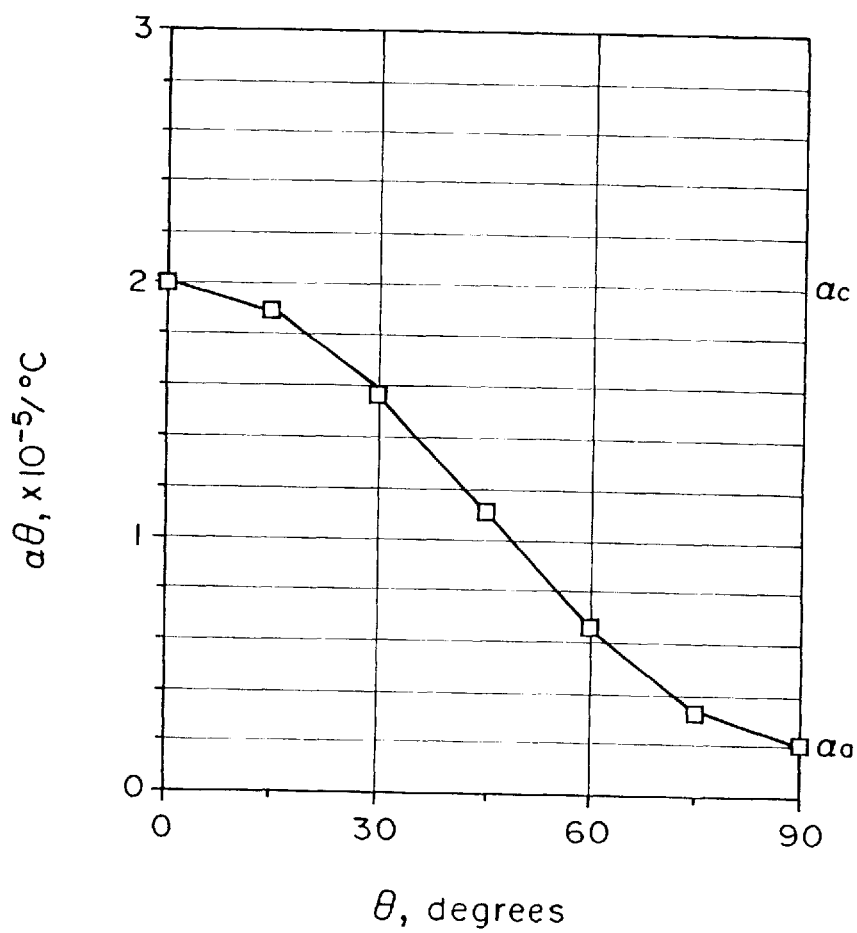
FIG. 3 is a graph showing the relationship between the thermal expansion coefficient of the substrate and the angle θ between the direction of the facet plane and the direction perpendicular to the substrate surface.

The thermal expansion coefficient αθ within the plane of a facet having a complementary angle θ of the angle formed between the direction of a normal line to the facet and the growing direction of the PBN as a function of θ can be calculated by assuming the values of αc, which is the thermal expansion coefficient in the growing direction of the PBN substrate and usually has a value of $20 \times 10^{-6}/°C.$, and αa, which is the thermal expansion coefficient in the direction within the surface of the PBN substrate, i.e. the direction perpendicular to the growing direction of the PBN, and usually has a value of $2 \times 10^{-6}/°C.$, from the following equation:

$$[1+\Delta T \cdot \alpha\theta]^2 = [\cos\theta(1+\Delta T \cdot \alpha c)]^2 + [\sin\theta(1+\Delta T \cdot \alpha a)]^2,$$

in which ΔT is the difference between the deposition temperature of the PBN and room temperature. When θ is 0°, αθ is equal to αc and, when θ is 90°, αθ is equal to αa. FIG. 3 is a graph showing the relationship between the value of αθ and θ assuming that $\alpha c = 20 \times 10^{-6}/°C.$ and $\alpha a = 2 \times 10^{-6}/°C.$ both by actual measurements (plots) and by calculation (curve) according to the above given equation. When θ=45°, the difference between αθ and αa is about one half of the difference between αc and αa. This equation teaches that, when the angle θ is in the range from 45° to 90° or, in other words, the complementary angle of θ is in the range from 0° to 45°, the difference in the thermal expansion coefficient between the substrate of boron nitride and the overcoating layer of PBN within the plane of the facet formed by mechanical working is so small that the internal stress can be greatly decreased and occurrence of cracks in and exfoliation of the overcoating layer can be prevented.

The substrate of the integral body prepared according to the invention is made from boron nitride which can be a body of PBN formed by the CVD method or a sintered body of boron nitride formed by the hot-press method. The graphite layer on the surface of the substrate is formed by the pyrolytic method to deposit PG over the whole surface of the substrate.

Figure 1F:
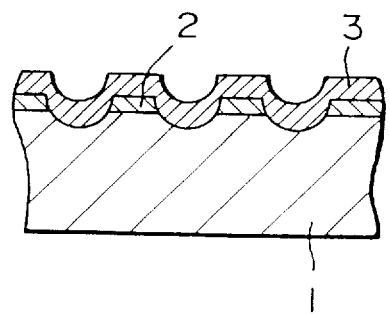

Following is a brief description of the procedure according to the invention by making reference to FIGS. 1a to 1f showing a partial cross section of a ceramic heater. FIG. 1a illustrate a vertical cross sectional view of a substrate 1 of boron nitride and FIG. 1b illustrate a vertical cross sectional view of the boron nitride substrate 1 provided with an undercoating layer of PG 2 formed thereon. FIG. 1c illustrates a vertical cross sectional view of the substrate 1 and the undercoating layer of PG 2 after a mechanical working to form grooves 5 each between line protrusions 6 with the facets 7 and the top surface in a trapezoidal cross sectional profile. The angle θ is the complementary angle of the angle formed between the direction of a normal line to the facet surface and the direction perpendicular to the surface of the substrate before the mechanical working shown in FIGS. 1a or 1b, which is the direction of growth of the substrate 1, when the substrate is formed by the deposition of PBN, or the direction of compression, when the substrate 1 is formed by the method of hot-press. It is essential in the invention that the angle θ is in the range from 45° to 90°. FIG. 1d illustrates a vertical cross sectional view of the double-coated body obtained by forming the overcoating layer 3 of PBN to cover the patterned PG layer 2 and the pattern-wise exposed surface of the substrate 1. FIGS. 1e and 1f are each an alternative to FIGS. 1c and 1d, respectively. In this alternative illustrated in FIG. 1e, the grooves formed by mechanical working each have a curved profile of the cross section instead of the trapezoidal cross sectional profile in FIG. 1c.

In the following, the present invention is described in more detail by way of an example for the preparation of a ceramic heater, which, however never limits the scope of the invention in any way.

EXAMPLE.

A PBN disc of 100 mm diameter and 1.2 mm thickness as a substrate (FIG. 1a) set in a CVD chamber was heated up to and kept at 1900° C. Deposition of PG on the surface of the substrate was performed under a pressure of 12.5 Torr inside of the chamber with continuous introduction of high purity propane gas at a rate of 5 SLM (standard liters per minute) and hydrogen at a rate of 20 SLM into the chamber and concurrent evacuation of the chamber for 7.5 hours until the thickness of the PG layer reached 50 μm (FIG. 1b). Thereafter, mechanical working was undertaken to form grooves by the pattern-wise removal of the PG layer in a depth d of 300 μm (FIG. 1c) to form a double-spiral pattern of a heater element shown in FIG. 2 with the angle θ of 60° by using a trapezoidal end mill.

Figure 2:
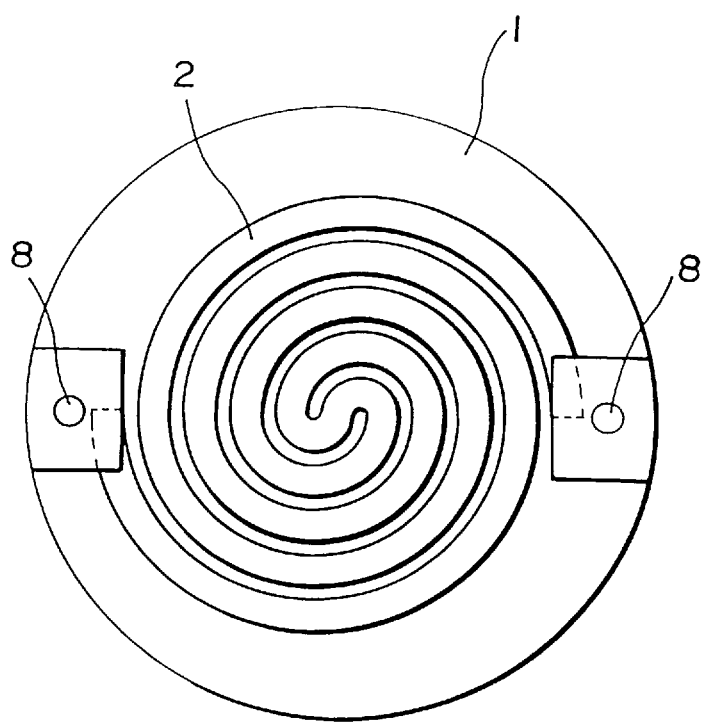
FIG. 2 is a plan view of a ceramic heater showing a double-spiral pattern of the graphite layer without overcoating of PBN.

The PBN substrate 1 with a patterned PG layer 2 was set in a CVD chamber and heated up to and kept at 1800° C. and pyrolytic deposition of PBN was performed at this temperature under a pressure of 8.7 Torr by continuously introducing boron trichloride gas, ammonia and hydrogen at rates of 1 SLM, 5 SLM and 20 SLM, respectively, for 6 hours until the thickness of the PBN layer 3 reached 50 μm (FIG. 1d). A ceramic heater was completed by providing terminals 8 to the ends of the double-spiral pattern of the PG layer as is shown in FIG. 2.

The thus obtained ceramic heater was subjected to the heating-cooling cycle test between 25° C. and 1000° C. in a vacuum chamber in which each cycle consisted of a heating stage by electric resistance at a rate of 200° C./minute and a cooling stage at a rate of 200° C./minute from 1000° C. to 600° C. and at a rate of 50° C./minute from 600° C. to 25° C. The result of this test was that absolutely no cracks were formed in the overcoating PBN layer 3 or no lifting or falling of the layer 3 was found after 20 cycles of this heat cycle test.

The result was as satisfactory as above when the mechanical working was conducted by using a cylindrical end mill so that the grooves formed thereby had a curved cross sectional profile as is illustrated in FIG. 1e instead of the trapezoidal cross sectional profile described above, otherwise under substantially the same conditions as above.

COMPARATIVE EXAMPLE.

The procedure for the preparation of a ceramic heater was substantially the same as in Example 1 except that the angle θ shown in FIG. 1c was 30° instead of 60°.

The result of the heat cycle test was the falling of the overcoating PBN layer was found already after only one cycle of heating and cooling.

What is claimed is:

1. In a method for the preparation of a double-coated ceramic article having an undercoating layer of graphite formed on a surface of a substrate body of boron nitride, the undercoating layer being disposed so as to expose a portion of the substrate body in a pattern, and an overcoating layer of pyrolytic boron nitride covering the graphite layer and exposed substrate surface which is prepared by:

a) forming a uniform coating layer over an entire surface of the substrate;

b) removing a part of the graphite coating layer by mechanical working so as to expose the substrate's surface in a pattern; and c) forming a layer of pyrolytic boron nitride over the surface of the graphite layer and the exposed substrate surface, the improvement which comprises, in step b), mechanically removing the part of the graphite layer to form a facet in the substrate layer and such that the angle formed between the direction of the line normal to a surface of the facet, and a line perpendicular to the plane of the graphite layer prior to the mechanical working is in the range from 0 degrees to 45 degrees, the angle being sufficient so as to decrease the differential between the thermal expansion coefficient of the pyrolytic boron nitride in its growing direction and the thermal expansion coefficient of the pyrolytic boron nitride in a direction perpendicular to its growing direction and decrease any internal stress in the pyrolytic boron nitride layer.

2. The method of claim 1 wherein the angle is between to 30 to 45 degrees.

3. The method of claim 2 wherein the angle is 30 degrees.

* * * * *